United States Patent
Ishii et al.

(10) Patent No.: US 8,735,821 B2
(45) Date of Patent: May 27, 2014

(54) INFRARED IMAGING DEVICE AND INFRARED IMAGING APPARATUS USING IT

(75) Inventors: Koichi Ishii, Kawasaki (JP); Kazuhiro Suzuki, Tokyo (JP); Hiroto Honda, Yokohama (JP); Hideyuki Funaki, Tokyo (JP); Risako Ueno, Tokyo (JP); Honam Kwon, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/428,746

(22) Filed: Mar. 23, 2012

(65) Prior Publication Data

US 2012/0241613 A1  Sep. 27, 2012

Related U.S. Application Data

(63) Continuation of application No. PCT/JP2009/004828, filed on Sep. 24, 2009.

(51) Int. Cl.
  *G01J 5/20* (2006.01)
  *H01L 27/146* (2006.01)
  *G01J 5/14* (2006.01)

(52) U.S. Cl.
  CPC ............. *G01J 5/14* (2013.01); *H01L 27/14649* (2013.01)
  USPC ...................................... 250/338.4

(58) Field of Classification Search
  CPC ............................. G01J 5/14; H01L 27/14649
  USPC ........................................ 250/338.4
  See application file for complete search history.

(56) References Cited

U.S. PATENT DOCUMENTS

| | | | |
|---|---|---|---|
| 6,809,320 B2 * | 10/2004 | Iida et al. | 250/338.4 |
| 2004/0169144 A1 | 9/2004 | Shibayama | |

FOREIGN PATENT DOCUMENTS

| | | |
|---|---|---|
| JP | 3763822 B | 4/2006 |
| JP | 3793033 B | 7/2006 |
| JP | 2006-300816 | 11/2006 |
| JP | 2008-145134 | 6/2008 |
| JP | 2008-298665 | 12/2008 |
| JP | 2008-304463 | 12/2008 |
| WO | WO 03/006939 A1 | 1/2003 |
| WO | WO 2003/006939 A1 | 1/2003 |

OTHER PUBLICATIONS

Machine translation of JP 2008-145134 A, downloaded Aug. 7, 2012.*
International Search Report issued on Jan. 12, 2010 for PCT/JP2009/004828 filed on Sep. 24, 2009 with English Translation.

(Continued)

*Primary Examiner* — Constantine Hannaher
(74) *Attorney, Agent, or Firm* — Oblon, Spivak, McClelland, Maier & Neustadt, L.L.P.

(57) ABSTRACT

An infrared imaging device, including: connection wiring portions arranged in matrix form on a substrate which is mounted in a package; first and second infrared detecting portions configured to convert intensity of absorbed infrared radiation into respective first and second signals, the second infrared detecting portion being smaller in thermal conductance than the first infrared detecting portion; and a lid member attached to the package so as to define an air-tight gap with the substrate, the connection wiring portions, the first and second infrared detecting portions being accommodated within the gap; wherein a degree-of-vacuum is measured within the gap and a warning issued based on the measured degree-of-vacuum.

7 Claims, 10 Drawing Sheets

(56) References Cited

OTHER PUBLICATIONS

International Written Opinion issued on Jan. 12, 2010 for PCT/JP2009/004828 filed on Sep. 24, 2009.

Charles Hanson et al.; Thin-film ferroelectrics: breakthrough; Proc. SPIE vol. 4721, pp. 90-99, 2002.
U.S. Appl. No. 14/064,588, filed Oct. 28, 2013, Honda, et al.

* cited by examiner

INFRARED IMAGING DEVICE AND INFRARED IMAGING APPARATUS USING IT

CROSS-REFERENCE TO RELATED APPLICATION(S)

This is a Continuation Application of PCT Application No. PCT/JP09/004828, filed on Sep. 24, 2009, which was published under PCT Article 21(2) in Japanese, the entire contents of which are incorporated herein by reference.

FIELD

Embodiments described herein relate generally to an infrared imaging device and an infrared imaging apparatus using it.

BACKGROUND

Infrared imaging devices utilizing infrared radiation can perform capturing day and night, and infrared radiation can pass through smoke and mist at a higher rate than visible light so that temperature information of a subject can be obtained. As such, infrared imaging devices have a broad application range including the defense field, the security field and the like (for example, as surveillance cameras and fire detection cameras).

Quantum infrared solid-state imaging devices are mainly used, and conventionally, a cooling mechanism is required in such quantum infrared solid-state imaging devices for low-temperature operation. However, in recent years, non-cooling infrared imaging devices which do not require such a cooling mechanism have been developed.

Such a non-cooling infrared imaging device includes a semiconductor substrate, a read wiring portion formed on the semiconductor substrate, a support structure which is disposed over a recess formed in a surface portion of the semiconductor substrate and has connection lines which are electrically connected to the read wiring portion, and a cell portion which is disposed over the recess and supported by the support structure. The cell portion has an infrared absorption layer for absorbing incident infrared radiation, and plural thermoelectric conversion elements, which are electrically connected to the support structure, are electrically insulated from the infrared absorption layer, and generates an electrical signal by detecting a temperature variation in the cell portion.

In the above non-cooling infrared imaging device, since a signal is generated based on heat generated in the cell portion through infrared radiation absorption, it is important to hold such heat without leakage. To this end, as described above, the cell portion is spaced from the semiconductor substrate and supported only by the support structure, and the neighboring atmosphere is kept in a medium-level vacuum state of 1 Pa or lower to enhance the heat insulation performance of the cell portion. To maintain such an atmosphere, the device is sealed in a vacuum atmosphere after being mounted in a package. However, it is difficult to keep, for a long time, the internal pressure of the sealed package at a value immediately after the sealing. That is, the internal pressure of the package may increase with the passage of time because various gasses are generated from materials located inside the package including the materials of the infrared imaging device, and slight leakage occurs through the sealing portion due to the difference between the pressures inside and outside the package. Although it is possible to suppress increase in internal pressure by disposing a getter for absorbing generated gasses inside the package, it is not always possible to keep the internal pressure at a desired value merely by such getter. If the internal pressure of the package increases, the heat insulation performance of the cell portion is degraded. As a result, the responsivity of the infrared imaging device is lowered, and it comes not to perform a prescribed function.

In view of above, the internal pressure of the package may be monitored. One example method is to mount a micro-Pirani element in a juxtaposed manner and measure an internal pressure based on its output. A micro-Pirani element may be formed in the same chip as the infrared imaging device. However, in these methods, a processing circuit is required in addition to a processing circuit for processing an output signal of the infrared imaging device, and thus, for example, the circuit scale is increased, electrical interference may occur between the infrared imaging device and the micro-Pirani element when they operate simultaneously, and the number of pads of the package is increased to decrease package options.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

DETAILED DESCRIPTION

An infrared imaging device, including: a substrate mounted in a package; connection wiring portions arranged in matrix form on the substrate; a first infrared detecting portion, as a first pixel, surrounded by the connection wiring portions and disposed so as to be spaced from the substrate, the first infrared detecting portion being configured to convert intensity of absorbed infrared radiation into a first signal; a first supporting beam having one end connected to the first infrared detecting portion and the other end connected to the connection wiring portions; a second infrared detecting portion, as a second pixel, surrounded by the connection wiring portions and disposed so as to be spaced from the substrate, the second infrared detecting portion being configured to convert intensity of absorbed infrared radiation into a second signal; and a second supporting beam having one end connected to the second infrared detecting portion and the other end connected to the connection wiring portions, the second infrared detecting portion being smaller in thermal conductance than the first infrared detecting portion; a lid member attached to the package so as to define a gap therewith in an air-tight manner, the substrate, the connection wiring portions, the first and second infrared detecting portions being accommodated within the gap; a degree-of-vacuum judging section configured to measure a degree of vacuum within the gap, based on a gradient of an approximate linear function representing magnitudes of the second signal and the first signal defined by assuming that a horizontal axis represents the magnitude of the first signal and that a vertical axis represents the magnitude of the second signal; and a judgment output unit configured to issue a warning if the degree-of-vacuum judging section judges that the gradient is smaller than a preset value.

Figure 1:
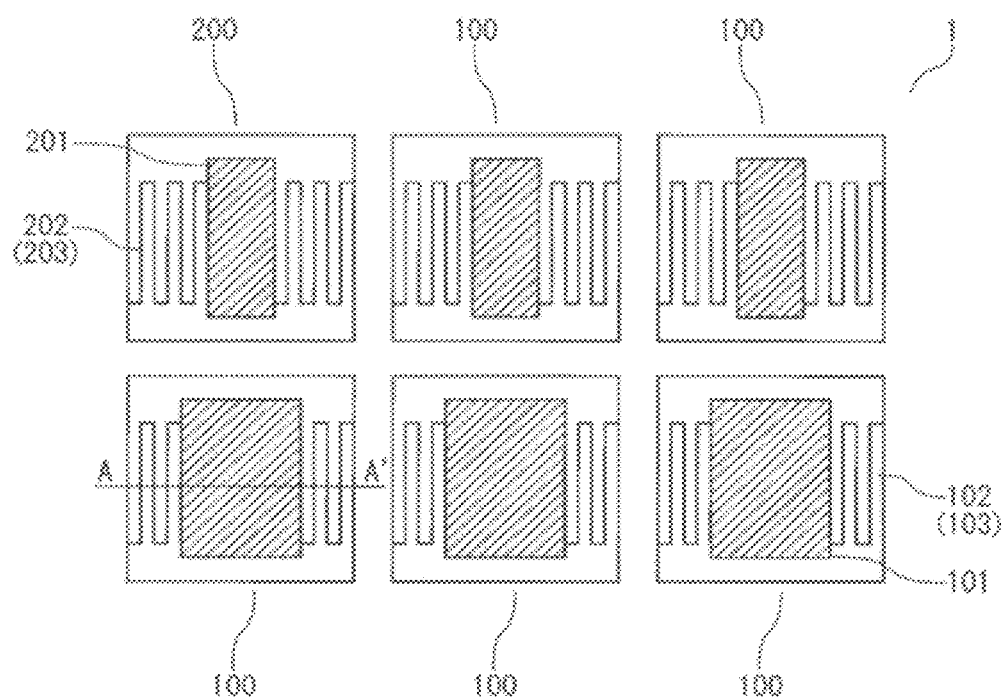
FIG. 1 illustrates an infrared imaging device according to an embodiment, from above.
Figure 2:
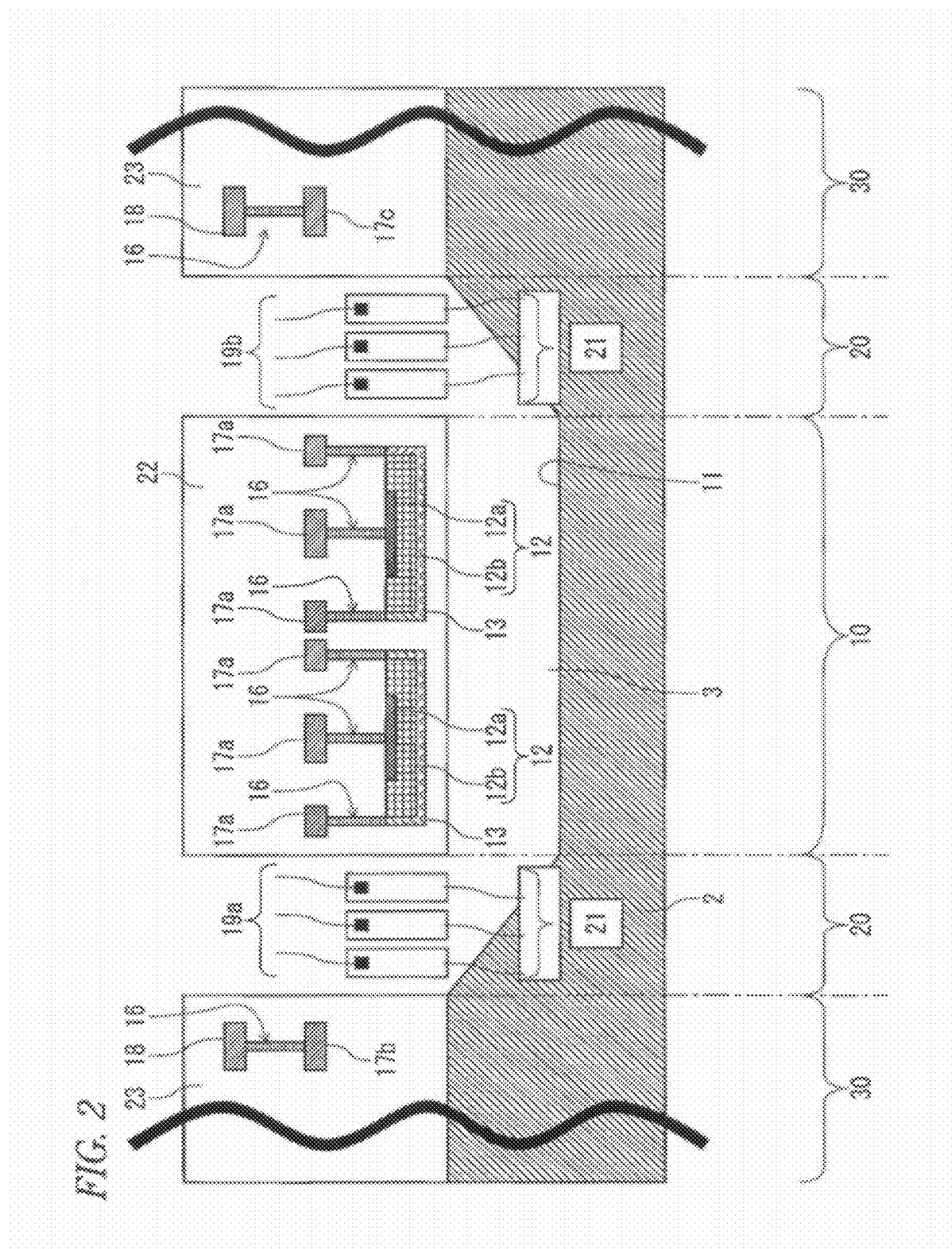
FIG. 2 cross-sectionally illustrates the infrared imaging device.

An infrared imaging device according to an embodiment will be described with reference to FIGS. 1 and 2. FIG. 1 is a top view of the infrared imaging device according to the embodiment which corresponds to arrayed pixels and which consists of two kinds of infrared detection cells (a first cell and a second cell, or a first pixel and a second pixel). The first cells 100 are an infrared detection cell for producing an infrared image, and the second cell 200 is a monitoring cell for detecting degree of vacuum. Each first cell 100 includes an infrared absorption portion 101 (first infrared detecting portion) and connection wiring portions 102 (second connection wiring portions) which function as supporting beams for holding the infrared absorption portion 101 within a cavity 103 thereof. Each second cell 200 includes an infrared absorption portion 201 (second infrared detecting portion) and connection wiring portions 202 (second connection wiring portions) which function as supporting beams for holding the infrared absorption portion 201 within a cavity 203 thereof. FIG. 2 cross-sectionally illustrates one first cell 100, along a cutting line A-A in FIG. 1. The second cell 200 is basically the same in structure as the first cells 100. As shown in FIG. 2, the infrared detection cell 100 includes an infrared detecting portion 10, connection wiring portions 20, and wiring forming portions 30. In the embodiment, the infrared detecting portion 10, the connection wiring portions 20, and the wiring forming portions 30 are formed on a silicon substrate 2. The infrared detecting portion 10 is surrounded by the wiring forming portions 30, and a gap 3 is formed between the infrared detecting portion 10 and the wiring forming portions 30. That is, the infrared detecting portion 10 is isolated from the wiring forming portions 30 via the gap 3. The infrared detecting portion 10 is connected to the wiring forming portions 30 by the connection wiring portions 20 which are formed in the gap 3. The infrared detecting portion 10 is also called a cell portion and has plural (in FIG. 2, two) thermoelectric conversion elements 12. In this embodiment, the thermoelectric conversion elements 12 are diodes. They may be resistors. The diodes 12 are connected to each other in series. Each diode 12 is provided with an n-type impurity layer 12a and a p-type impurity layer 12b formed in a semiconductor layer and thus has a pn junction consisting of the impurity layers 12a and 12b. A p$^+$ impurity layer (p-type high-concentration impurity layer) 13 is formed around the p-type impurity layer 12b. The diode 12 is covered with an infrared absorption layer (SiN, SiO$_2$, or the like) 22 which is made of an insulative material and absorbs infrared radiation. The n-type impurity layer 12a and the p$^+$ impurity layer 13 are electrically connected, via contacts 16, to wiring electrodes 17a which are formed in the infrared absorption layer 22. The plural diodes 12 are connected to each other in series by the wiring electrodes 17a.

The connection wiring portions 20, which function as supporting beams for holding the cell 12 in the infrared imaging device within a cavity 11, are each provided with insulating layers 21 and connection lines 19a or 19b formed in the insulating layers 21. The connection lines 19a of the one connection wiring portion 20 are connected to one end of the series circuit of the plural diodes 12, and the connection lines 19b of the other connection wiring portion 20 are connected to the other end of the series circuit of the plural diodes 12.

The wiring forming portions 30 are formed on the silicon substrate 2 and each provided with the insulating layer 23, wiring electrodes 17a and 18, and contacts 16 which connects the wiring electrodes 17a and 18. The wiring electrode 17b is connected to the one end of the series circuit of the plural diodes 12 via the connection lines 19a. The wiring electrode 17c is connected to the other end of the series circuit of the plural diodes 12 via the connection lines 19b.

The infrared absorption layer 22 absorbs infrared radiation incident on the infrared imaging device to thereby increase the temperature thereof. And, this temperature variation is converted into an electrical signal by the thermoelectric conversion elements (diodes) 12. Heat will escape from the infrared imaging device along the respective connection lines 19a and 19b and the gap 3. Thus, the heat insulation performance of the infrared imaging device is determined by the thermal conductance values of the connection lines 19a and 19b and the degree of vacuum of the gap 3. In this embodiment, the heat insulation performance of the infrared imaging device is enhanced as the connection lines 19a and 19b become longer or narrower or the degree of vacuum of the gap 3 is made higher.

Next, the structure of the second cell 200 will be described. Whereas the cell 200 has the same size as the cells 100, the former is different from the latter in the size of the infrared absorption portion 201 (infrared detecting portion 10) and the structure of the connection wiring portions 202 (supporting beams 20). That is, in the cell 200, the area of the infrared absorption portion 201 is made smaller. Accordingly, the regions of the connection wiring portions 202 are made wider, and the connection wiring portions 202 are made longer (see FIG. 1). As a result, the heat insulation performance of the cell 200 is higher than that of the cells 100, and hence, the cell 200 has higher responsivity to incident infrared radiation than the cells 100.

Figure 3:
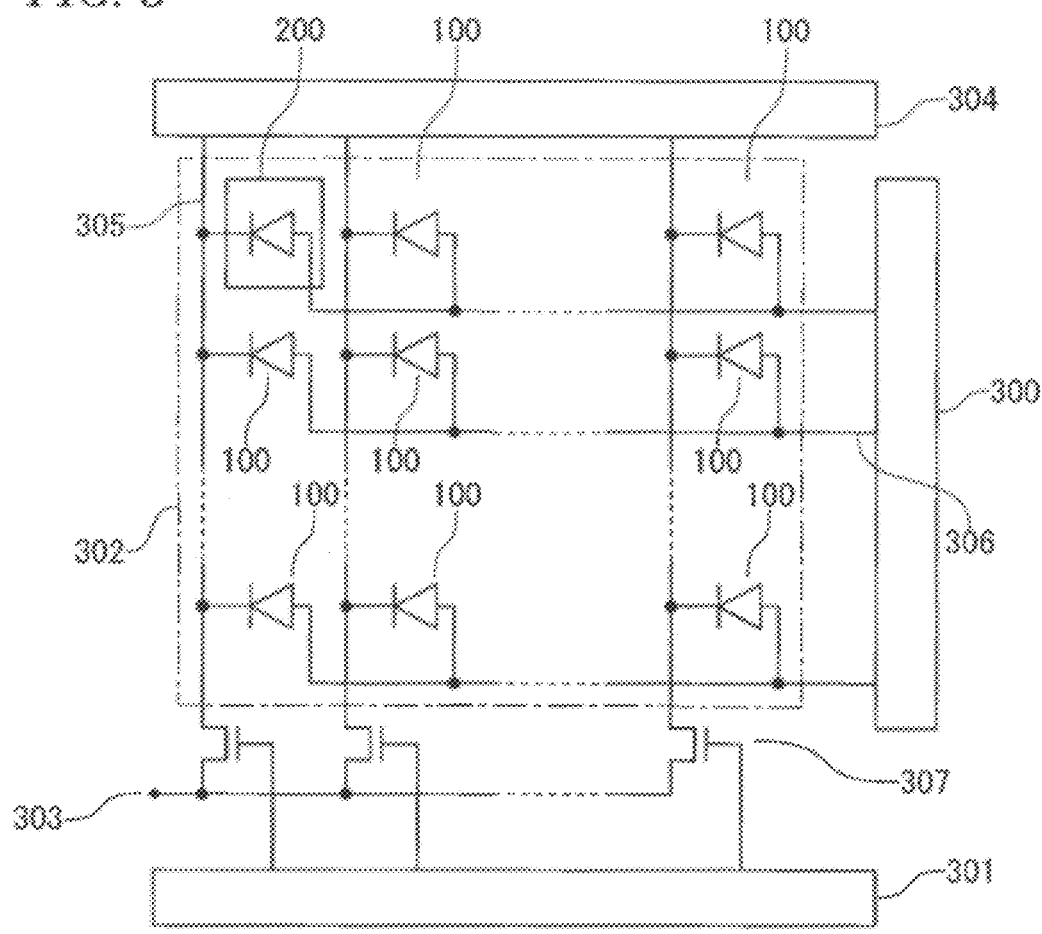
FIG. 3 illustrates a drive circuit of the infrared imaging device.

FIG. 3 illustrates a drive/read circuit of the infrared imaging device. The infrared detection cells 100 for converting incident infrared radiation into electrical signals are arranged two-dimensionally on a semiconductor substrate. A vertical address circuit 300 and a horizontal address circuit 301 for pixel selection are disposed adjacent to an infrared detection pixel array 302. An output portion 303 is provided which sequentially outputs signals that are supplied from selected pixels. A forward bias current controlled by a constant current source 304 flows an infrared detection pixel selected by the horizontal address circuit 301, that is, flows through current paths consisting of vertical signal lines 305, selected pixels, and a horizontal address line 306. Signal voltages occurring on the vertical signal lines 305 are sequentially selected by the horizontal address circuit 301 and output. FIG. 3 shows a simplest example configuration in which signal voltages occurring on the vertical signal lines 305 are directly output via column selection transistors 307 which are sequentially selected by the horizontal address circuit 306. Alternatively, since such signal voltages are faint, a structure for amplifying signal voltages on a column-by-column basis may be provided if necessary. A detailed circuit operation is the same as described in JP-3793033-B.

Figure 4:
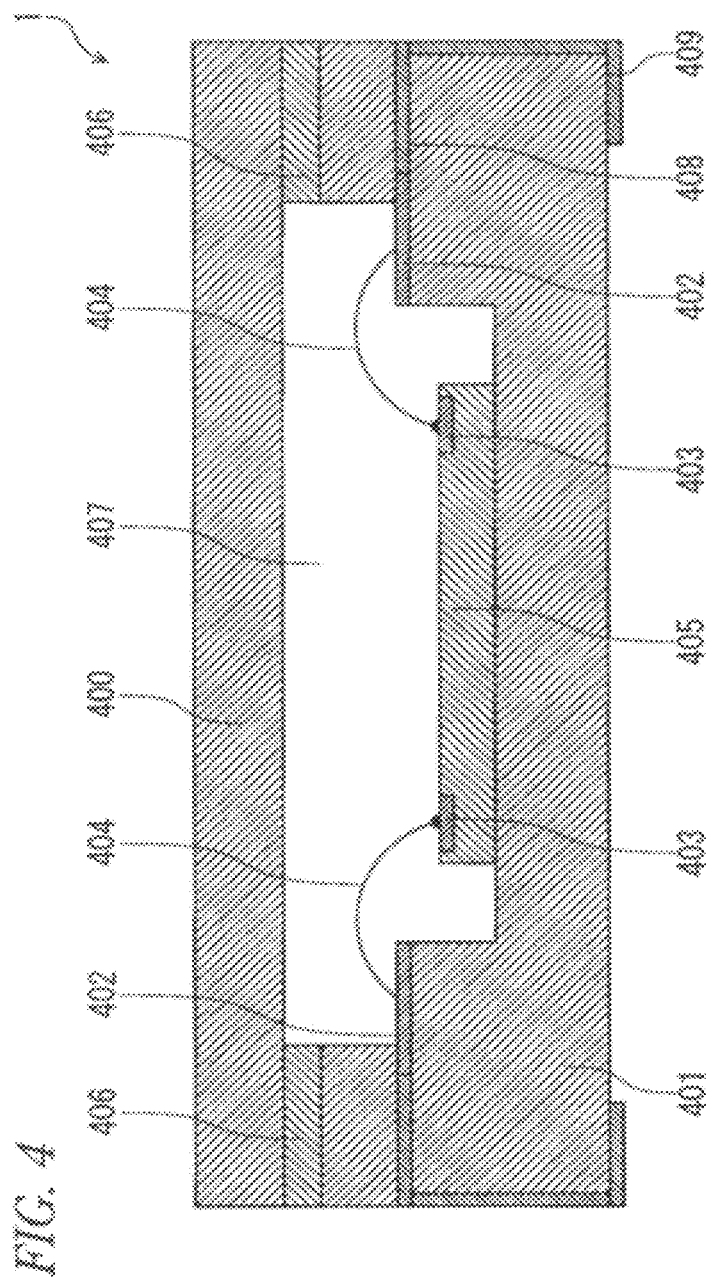
FIG. 4 illustrates a package structure of the infrared imaging device.

FIG. 4 illustrates a package structure of a sensor chip 405 which includes the infrared imaging device. As shown in the figure, the sensor chip 405 is die-mounted on the bottom of a package 401, and pads 403 of the sensor chip 405 are connected to package electrodes 402 by bonding wires 404. Signals that are output from the sensor chip 405 are sent to a processing circuit located outside the package via the pads 403, the bonding wires 404, lead wires 408, and lead electrodes 409. Signals for driving the sensor chip 405 are sent from the processing circuit located outside the package to the sensor chip 405 via the lead electrodes 409, the lead wires 408, the bonding wires 404, and the pads 403. Hermetic sealing is done using a lid member 400 made of an infrared-transparent material which is disposed on the package 401. Sealing between the package 401 and the lid member 400 is done with a sealing agent 406. During a sealing process which is executed in vacuum, a cavity 407 of the package is kept in a vacuum state. However, after a lapse of a long time, the degree of vacuum of the inside of the package may lower due to generation of out gasses from the constituent materials, slight leakage through the sealing portion, etc.

Figure 5:
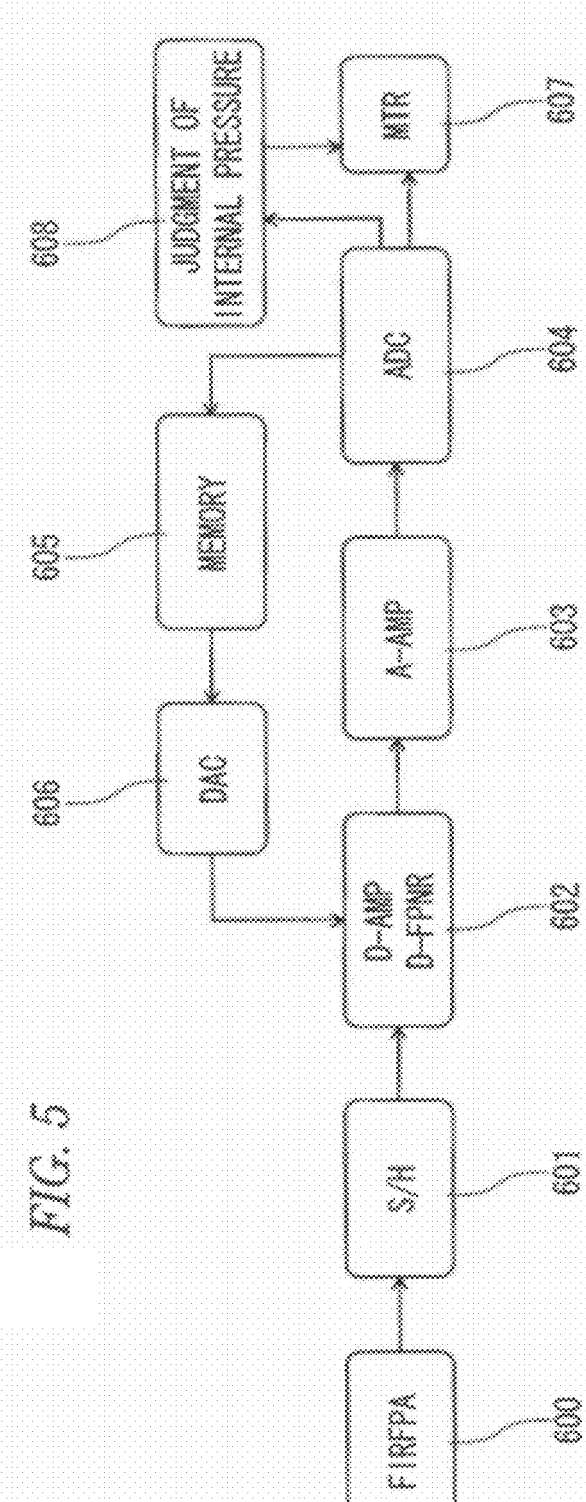
FIG. 5 illustrates a processing circuit for processing an output signal of the infrared device.

Then, how an output signal of the sensor package in which the infrared sensor chip is mounted is processed will be described with reference to FIG. 5. FIG. 5 shows the configuration of a sensor output signal processing circuit including a sensor package 600. The processing circuit includes the sensor package 600, a sample-and-hold section 601, a differential amplifier section 602, an analog amplifier section 603, an Analog-to-Digital (AD) conversion section 604, a memory 605, a Digital-to-Analog (DA) conversion section 606, a monitor 607, and a degree-of-vacuum judging section 608. First, the sensor package 600 is kept in a state that no external infrared radiation is incident on it and an offset component of a sensor output that does not include external infrared information is stored in the memory 605.

More specifically, an output signal of the sensor package 600 is supplied to the sample-and-hold section 601, where it is sampled and held for a prescribed time to prepare for later digitization. The output signal simply goes through the differential amplifier section 602 and the analog amplifier section 603, and then, digitized in the DA conversion section 604. Resulting information is stored in the memory. After the sensor package 600 is rendered in a state that an external infrared signal can be input, an output signal of the sensor package 600 is sampled and held by the sample-and-hold section 601, and then, input to the differential amplifier section 602 (signal waveform-1).

On the other hand, the offset component stored in the memory 605 is converted by the DA conversion section 606 into an analog signal, which is input to the other input portion of the differential amplifier section (signal waveform-2). The differential amplifier section 602 subtracts the signal waveform-2 (only the offset component) from the signal waveform-1 (the infrared information is superimposed on the offset component) and outputs a signal representing only the infrared information. The output of the differential amplifier section 602 is amplified by the analog amplifier section 603, digitized by the AD conversion section 604, and output to the monitor 607, which displays a resulting moving image. The digitized signal is also input to the degree-of-vacuum judging section 608, which judges a vacuum state in the sensor package.

Figure 6:
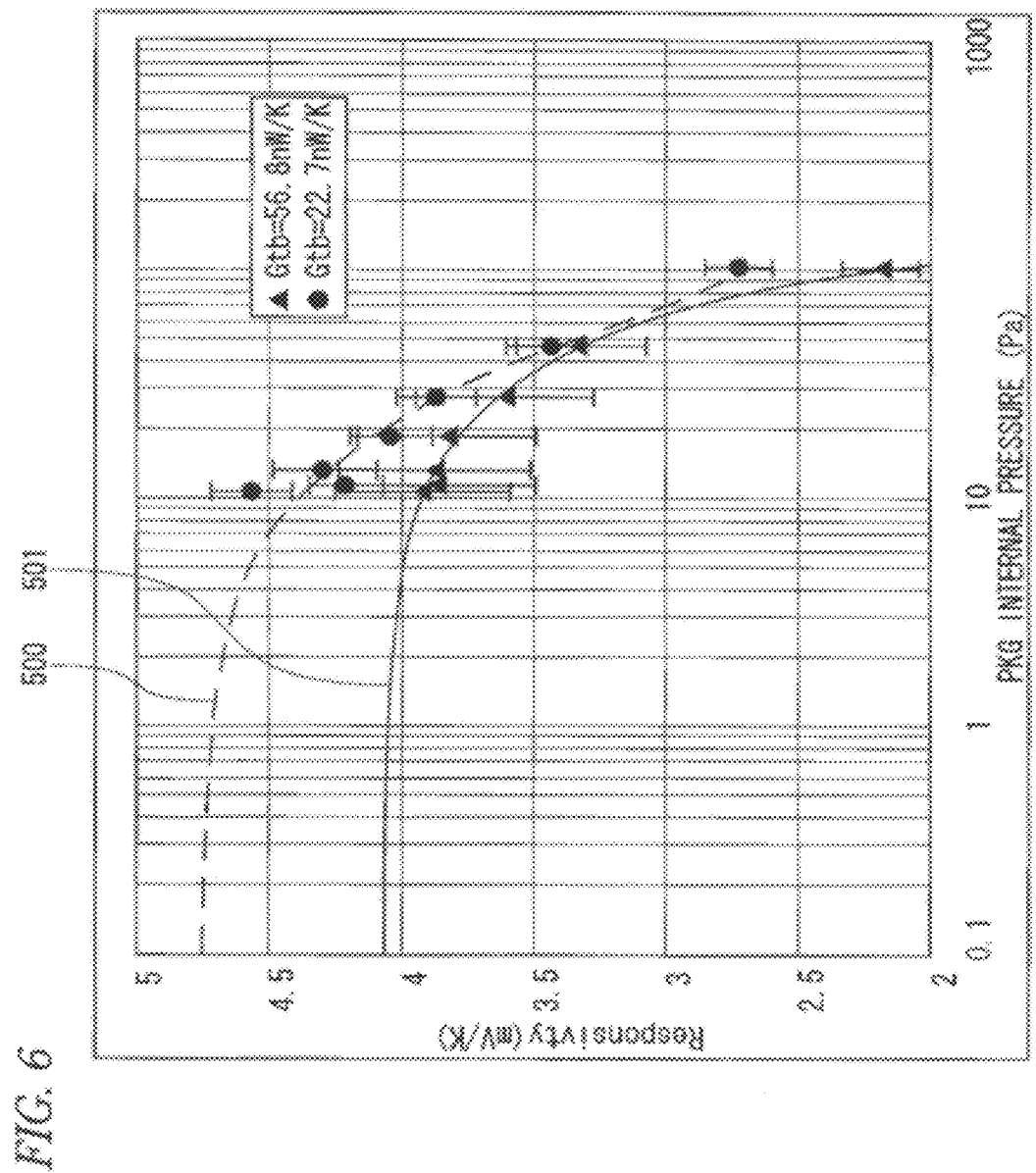
FIG. 6 illustrates degree-of-vacuum degradation detection in the embodiment.
Figure 7:
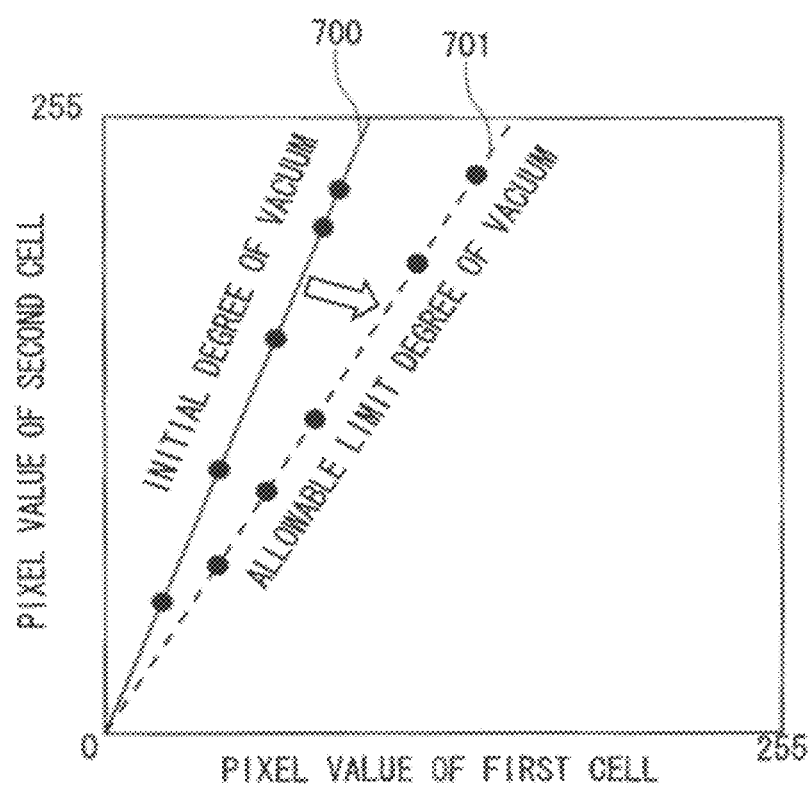
FIG. 7 illustrates degree-of-vacuum degradation detection in the embodiment.

A method for detecting degree-of-vacuum degradation using the second cell 200 will be described with reference to FIGS. 6 and 7. FIG. 6 illustrates characteristic curves with the heat insulation performance (first cells 100 and second cell 200) as a parameter. The horizontal axis represents the package internal pressure and the vertical axis represents the sensor responsivity. The numerical values written in the figure are thermal conductance values (nW/K) as indices of heat insulation performance (the smaller the value, the higher the heat insulation performance). Each characteristic curve indicates a tendency that the responsivity increases as the internal pressure decreases, that is, the degree of vacuum increases, and the responsivity is saturated in a certain region. It is seen that the internal pressure at which the responsivity starts to be saturated is shifted to the lower pressure side as the heat insulation performance becomes higher. Since the second cell 200 is designed so as to exhibit higher heat insulation performance and higher responsivity than the first cells 100, the second cell 200 exhibits a characteristic 501 in the figure (higher heat insulation performance) and the first cells 100 exhibit a characteristic 500 in the figure (lower heat insulation performance). If the initial package internal pressure is 0.1 Pa and the allowable degree of vacuum for functioning of the infrared imaging device is set at 5 Pa, the responsivity of the first cells 100 is decreased by about 1.7% when the package internal pressure is degraded to 5 Pa. On the other hand, the second cell 200 experiences a responsivity variation of as large as 3.7% when the pressure is changed from the initial value to 5 Pa. This difference between the responsivity variations should appear as a difference between monitor-displayed pixel values (see FIG. 5). Basically, such a difference between responsivity variations cannot be extracted unless the same infrared radiation energy is incident on the first cells 100 and the second cell 200. Since the infrared radiation energy incident on the infrared imaging device is not uniform, it is substantially impossible to extract a difference between responsivity variations merely by comparing the magnitudes of pixel values of the first cells 100 and the second cell 200. In view of this, characteristic curves shown in FIG. 7 are used. More specifically, a corresponding relationship between the pixel values of particular first cell 100 and second cell 200 that are adjacent to each other is plotted, whereby a characteristic curve 700 having a particular slope which reflects a responsivity difference between the first cell 100 and the second cell 200. When the degree of vacuum of the sensor package is lowered, since the responsivity of the first cell 100 is decreased more than that of the second cell 200, the slope of the characteristic curve is decreased, and a curve 701 is obtained (see FIG. 7). It can be judged that the degree of vacuum has become lower than an allowable value when $\alpha \le $th is satisfied where $\alpha$ is the slope of a characteristic curve and $\alpha$th (set value) is the slope of a characteristic curve that is obtained when the degree of vacuum of the sensor package is equal to 5 Pa. This degree-of-vacuum judgment is performed by the degree-of-vacuum judging section 608 shown in FIG. 5.

Figure 8:
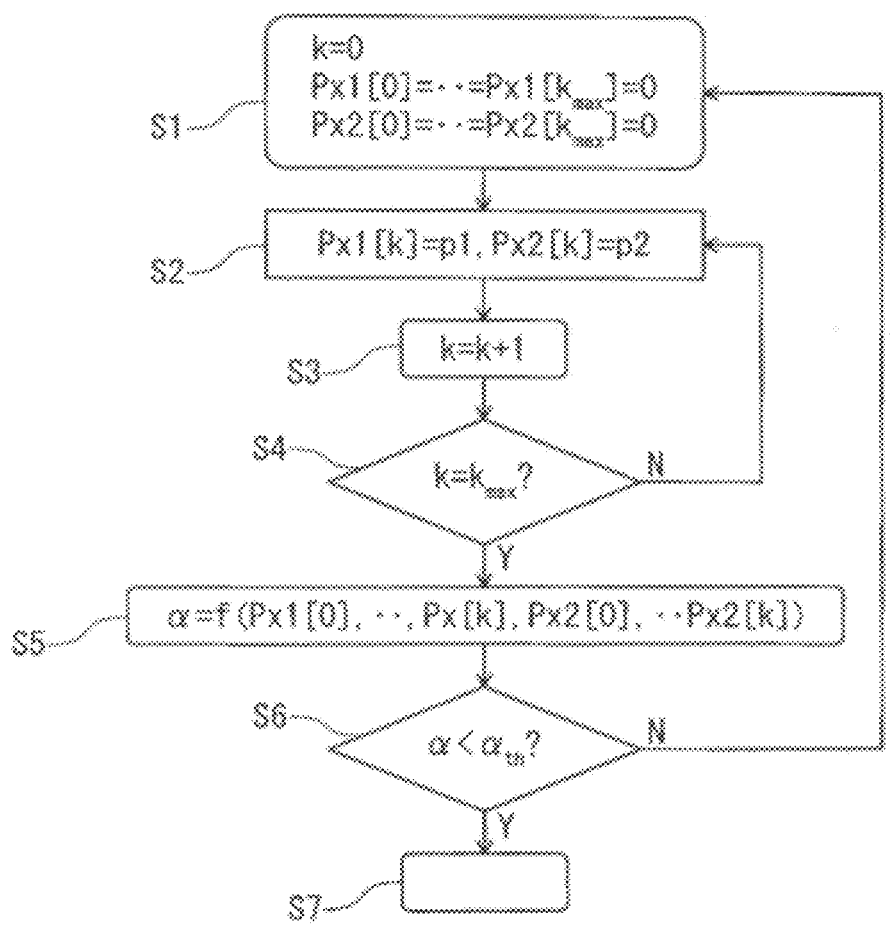
FIG. 8 illustrates the processing circuit for processing an output signal of the infrared device.
Figure 9:
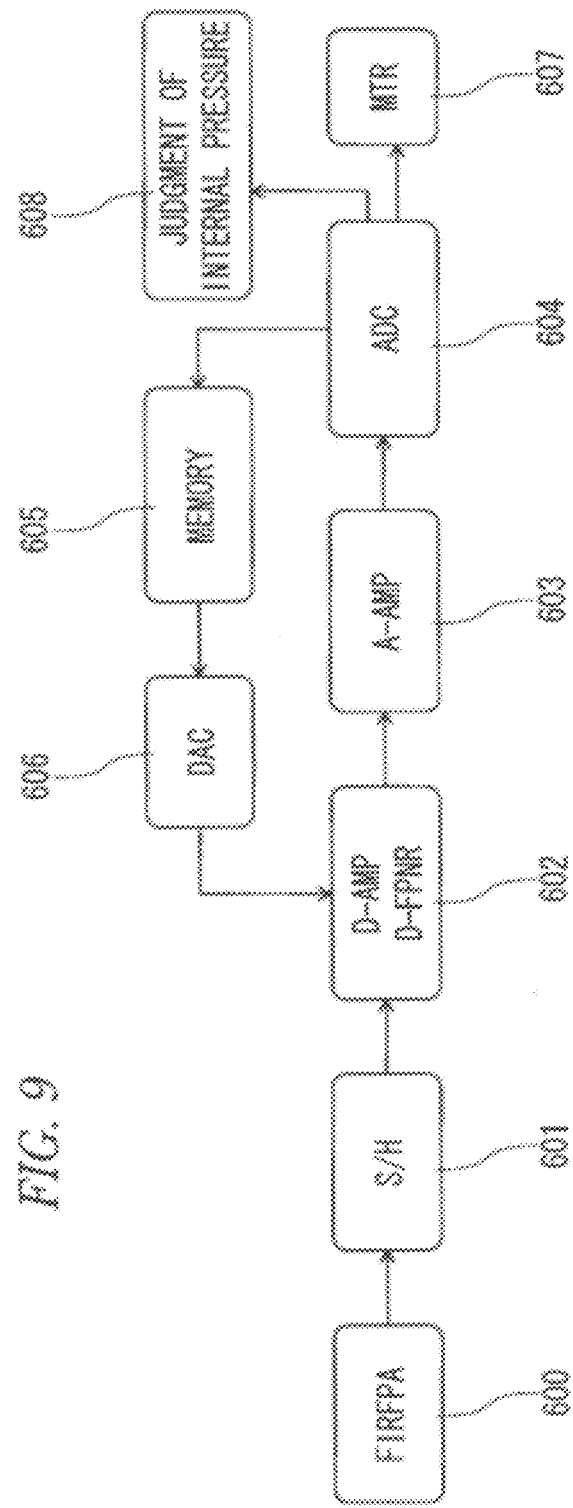
FIG. 9 illustrates the processing circuit for processing an output signal of the infrared device.

FIG. 8 is a flowchart of a degree-of-vacuum judgment process which is executed in the degree-of-vacuum judging section 608. First, after the number of times of pixel value reading is reset (S1), a pixel value p1 of a first cell 100, and a pixel value p2 of a second cell 200 of a certain frame are stored in a pixel array px1[k], px2[k] (S2). Then, after the number of times of pixel value reading is incremented (S3), it is judged whether or not the number of times of reading has reached a preset number (S4). If the number of times of reading has not reached the preset number yet, respective pixel values of the next frame are stored further (S2). If the number of times of reading has reached the preset number, $\alpha$ that satisfies a linear equation $y=\alpha x$ is calculated by a least square method using a pixel array px1[k], px2[k] stored so far (S5), where x is the pixel value p1 of the first cell 100 and y is the pixel value p2 of the second cell 200. If $\alpha$ is larger than or equal to the threshold value $\alpha$th, it is judged that the degree of vacuum is within an allowable range (S6), and a pixel value reading process is started again from the next frame (S1). On the other hand, if α is smaller than αth, it is judged that the degree of vacuum has degraded (S6), and the process moves to the next step (S7). At step S7, a judgment output unit (not shown) which has received the judgment result of the degree-of-vacuum judging section 608 issues, to the user, a warning to the effect that the degree of vacuum has degraded and the sensor performance will be lowered soon. FIG. 9 shows signal output processing for displaying a warning on the monitor 607, which is added to the processing of FIG. 5. If judging that the degree of vacuum of the sensor package is outside the allowable range, the internal pressure judging section 608 sends a signal to the monitor 607, and the monitor 607 displays a warning to that effect. In this case, the monitor 607 also serves as the judgment output unit.

Figure 10:
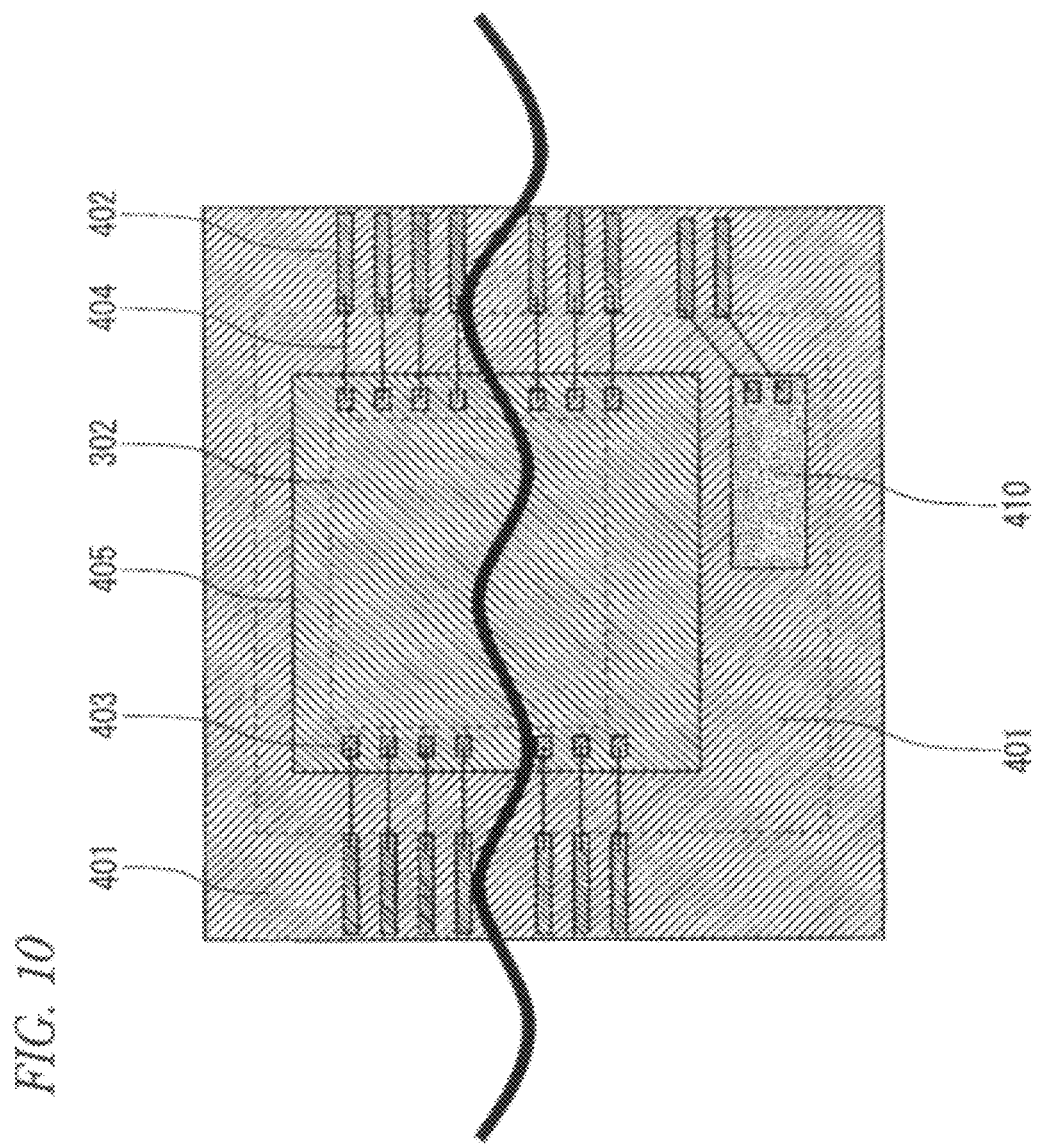
FIG. 10 illustrates the package structure of the infrared imaging device, from above.

Following options may be adapted. When the degree of vacuum inside the sensor package is lowered, the sensor output becomes weak, and hence, it is effective to increase the amplification factor inside the sensor. More specifically, the original state of an image can be restored by increasing the amplification factor inside the sensor and thereby increasing its output level by adjusting the pulse amplitude of a source voltage SS of an amplification transistor (refer to JP-3793033-B). When a getter is provided in the package as shown in FIG. 10, the original degree of vacuum in the sensor package can be restored by reactivating the getter by energizing it. FIG. 10 illustrates the sensor package of FIG. 4 from above. As shown in FIG. 4, the bottom of the package 401 where the sensor chip 405 is mounted is low in height. This low-height portion is indicated by a broken line in FIG. 10. For example, a getter 410 made of a zirconia-based metal may be disposed on this portion. The shape and the position of the getter are not limited to those shown in FIG. 10.

Usually, the degree of vacuum of a sensor package degrades gradually; it is unlikely that it degrades rapidly from a certain time point. Therefore, the above-described degree-of-vacuum degradation detection process may be executed every predetermined number of frames or every time the apparatus is activated.

The heat insulation performance of the second cell 200 can also be made higher than that of the first cells 100 by setting the connection wiring portions 202 of the second cell as long as but narrower than the connection wiring portions 102 of the first cells 100. The same advantages can thus be obtained.

The second cell 200 is different from the first cells 100 in the specifications of the infrared detecting portion 10 and the support portions 20. The same advantages can also be obtained by setting the depths of their gaps 3 different from each other.

In the embodiment, x represents the pixel value p1 of the first cell 100 and y represents the pixel value p2 of the second cell 200. Alternatively, x and y may represent the pixel value p2 of the second cell 200 and the pixel value p1 of the first cell 100, respectively. In the latter case, it is judged that the degree of vacuum has become lower than the allowable value when a that satisfies the approximate linear equation y=αx is compared with the set value αth and α≥αth is satisfied.

According to the embodiment, degradation of the internal pressure of the package can be detected before lowering of the responsivity of the infrared imaging device without adding a micro-Pirani element or the like or changing the structure of the device to a large extent. A measure for increasing the internal pressure of the package or increasing the responsivity can be taken before lowering of the responsivity of the infrared imaging device. Therefore, the infrared imaging function can be maintained for a long time.

The invention claimed is:

1. An infrared imaging device, comprising:
   a package;
   a substrate mounted on the package;
   connection wiring portions arranged in matrix form on the substrate;
   a first cell including:
      a first infrared detecting portion, as a first pixel, surrounded by the connection wiring portions and disposed so as to be spaced from the substrate, the first infrared detecting portion being configured to convert intensity of absorbed infrared radiation into a first signal; and
      a first supporting beam including a first wiring connected between a respective first connection wiring portion and said first infrared detecting portion to pass the first signal to said first connection wiring portion, said first supporting beam supporting said first infrared detecting portion;
   a second cell including:
      a second infrared detecting portion, as a second pixel, surrounded by the connection wiring portions and disposed so as to be spaced from the substrate, the second infrared detecting portion being configured to convert intensity of absorbed infrared radiation into a second signal; and
      a second supporting beam including a second wiring connected between a respective second connection wiring portion and said second infrared detecting portion to pass the second signal to said second connection wiring portion, said second supporting beam supporting said second infrared detecting portion, the second wiring being smaller in thermal conductance than the first wiring;
   a lid member attached to the package so as to define a gap therewith in an air-tight manner, the substrate, the connection wiring portions, the first cell and the second cell being accommodated within the gap;
   a degree-of-vacuum judging section configured to measure a degree of vacuum within the gap, based on a gradient of an approximate linear function representing magnitudes of the second signal and the first signal defined by assuming that a horizontal axis represents the magnitude of the first signal and that a vertical axis represents the magnitude of the second signal; and
   a judgment output unit configured to issue a warning if the degree-of-vacuum judging section judges that the gradient is smaller than a preset value.

2. The device of claim 1,
   wherein the second wiring is longer than the first supporting beam.

3. The device of claim 1,
   wherein the second wiring is smaller in cross section than the first supporting beam.

4. The device of claim 1,
   wherein the second infrared detecting portion is more distant from the substrate than the first infrared detecting portion is.

5. The device of claim 1, further comprising:
   an amplifying section configured to amplify the first signal and the second signal at a set amplification factor,
   wherein the amplification factor is increased if the degree-of-vacuum judging section judges that the gradient is smaller than the preset value.

6. The device of claim 1, further comprising:
a getter disposed within the gap,
wherein the getter is activated if the degree-of-vacuum judging section judges that the gradient is smaller than the preset value.

7. The device of claim 1,
wherein the approximate linear function is obtained by connecting points each of which represents a set of magnitudes of the second signal and the first signal corresponding to an input infrared radiation.

* * * * *